(12) United States Patent
Kim et al.

(10) Patent No.: US 7,131,217 B2
(45) Date of Patent: Nov. 7, 2006

(54) APPARATUS AND METHOD FOR DRYING SEMICONDUCTOR WAFERS USING IPA VAPOR DRYING METHOD

(75) Inventors: Jung-Min Kim, Suwon (KR); Young-hee Kim, Yongin (KR); Myung-hwan Shin, Yongin (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/384,745

(22) Filed: Mar. 11, 2003

(65) Prior Publication Data

US 2004/0020072 A1 Feb. 5, 2004

(30) Foreign Application Priority Data

Aug. 1, 2002 (KR) .................. 10-2002-0045611

(51) Int. Cl.
*F26B 13/06* (2006.01)

(52) U.S. Cl. .................. 34/630; 34/646; 134/902

(58) Field of Classification Search ........... 34/629, 34/630, 646, 218, 239, 444, 448; 134/902
See application file for complete search history.

(56) References Cited

U.S. PATENT DOCUMENTS

| 4,816,081 | A | * | 3/1989 | Mehta et al. ............. 134/30 |
| 5,435,075 | A | * | 7/1995 | Shiraishi et al. ............. 34/58 |
| 5,634,978 | A | * | 6/1997 | Mohindra et al. ............ 134/2 |
| 6,139,645 | A | * | 10/2000 | Leenaars et al. ............. 134/30 |
| 6,427,359 | B1 | * | 8/2002 | Scranton et al. ............. 34/444 |
| 6,430,840 | B1 | * | 8/2002 | Jung ............. 34/468 |

FOREIGN PATENT DOCUMENTS

| JP | 10-41265 | 2/1989 |
| JP | 3-232228 | 10/1991 |
| KR | 1999-0079451 | 11/1999 |

* cited by examiner

*Primary Examiner*—S. Gravini
(74) *Attorney, Agent, or Firm*—Harness, Dickey, & Pierce, P.L.C.

(57) ABSTRACT

An apparatus for drying semiconductor wafers includes a bath for receiving semiconductor wafers and for holding a fluid, a chamber for providing an area where vapor is flowable over the bath, a supply pipeline for supplying vapor to the chamber, a vapor discharging pipeline for expunging vapor in the chamber, a fluid discharging pipeline for draining fluid in the chamber therefrom, and a protector for maintaining a distance between the semiconductor wafers during a drying process.

26 Claims, 7 Drawing Sheets

CONVENTIONAL ART

FIG. 2A

CONVENTIONAL ART

FIG. 2B

CONVENTIONAL ART

FIG. 3A

CONVENTIONAL ART

FIG. 3B

CONVENTIONAL ART

FIG. 3C

CONVENTIONAL ART

FIG. 3D

CONVENTIONAL ART

APPARATUS AND METHOD FOR DRYING SEMICONDUCTOR WAFERS USING IPA VAPOR DRYING METHOD

This application claims the priority of Korean Patent Application No. 2002-45611, filed Aug. 1, 2002, in the Korean Intellectual Property Office, the entire contents of which is hereby incorporated herein by reference.

BACKGROUND OF THE INVENTION

1. Field of the Invention

The present invention generally relates to an apparatus for drying a semiconductor wafer, and more particularly, to an apparatus for drying a semiconductor wafer using an isopropyl alcohol (IPA) vapor drying method.

2. Description of the Related Art

In general, a cleaning process of a semiconductor chip includes the removal of impurities generated on a semiconductor wafer during a manufacturing process. The cleaning process may include processing the semiconductor wafer using chemical solutions, rinsing the chemically processed semiconductor wafer using deionized water (DIW), and drying the rinsed semiconductor wafer.

In the prior art, a spin drying method is commonly used to dry a semiconductor wafer. Recently, due to an increase in an integration density of semiconductor devices, a vapor drying method has been used. The vapor drying method takes uses isopropyl alcohol (IPA) vapor to remove the DIW.

In a conventional apparatus for drying semiconductor wafers, semiconductor wafers are loaded in a chamber and an IPA solution is supplied into the chamber. The IPA solution supplied into the chamber is vaporized by heat produced by a heater positioned under the chamber. As the IPA solution is vaporized, the DIW remaining on the semiconductor wafers substantially removed.

The conventional apparatus for drying semiconductor wafers cannot precisely control the degree at which the IPA solution is vaporized. If the IPA solution is excessively vaporized in the chamber, a considerable amount of carbon (C) remains on the surfaces of the dried semiconductor wafers.

Recently, an apparatus for drying semiconductor wafers using IPA vapor, which includes an integrated bath and chamber, has been suggested. According to this apparatus, during a drying process DIW overflows the bath, and nitrogen gas and IPA vapor can be supplied to the chamber. More particularly, a drying process according to the apparatus is performed as follows. The bath, in which a semiconductor wafer is loaded, is made to overflow with DIW, and then nitrogen gas and IPA vapor are supplied from above the semiconductor wafer into the chamber. Simultaneously, the DIW is slowly discharged toward a lower part of the semiconductor wafer.

Figure 1:
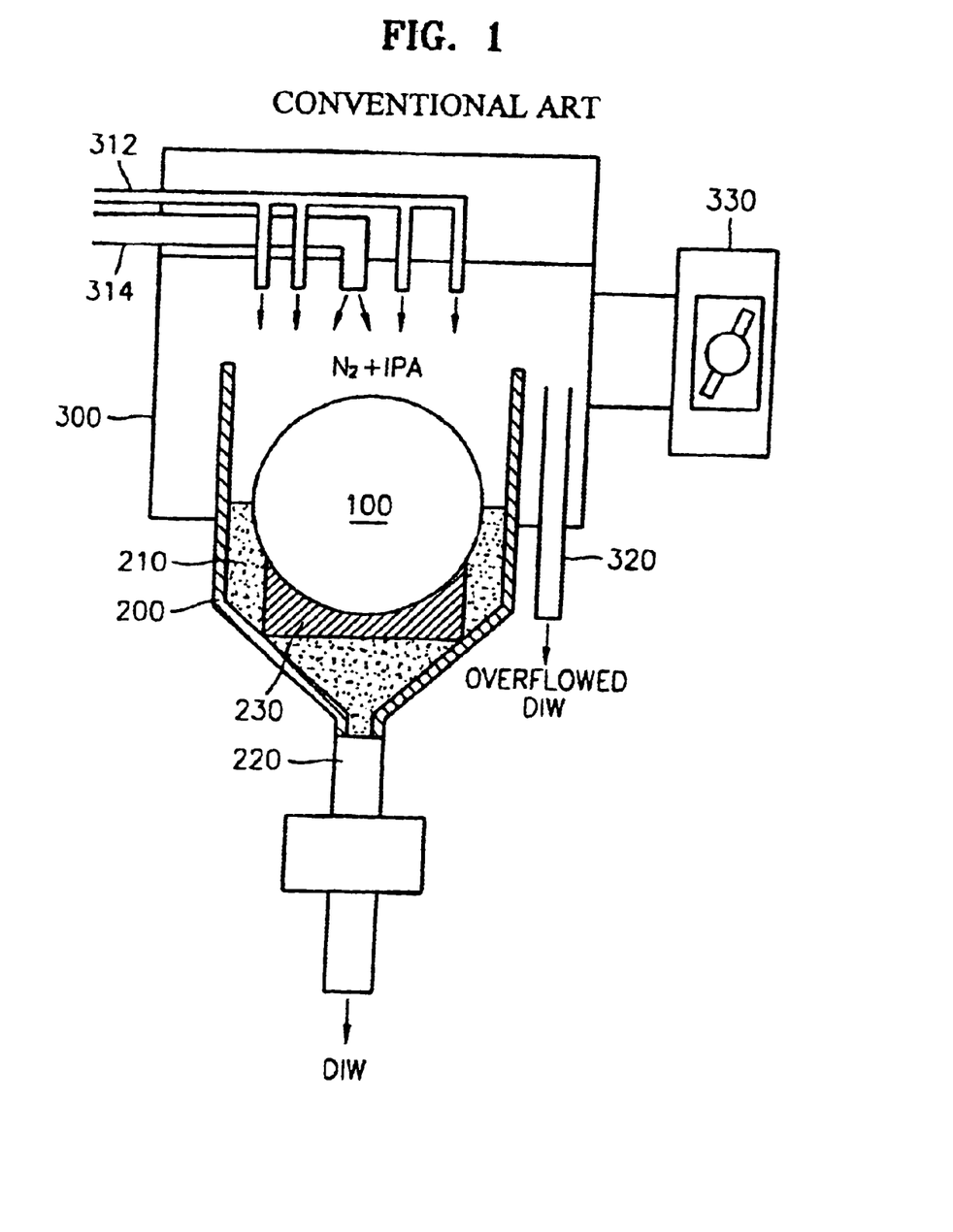
FIG. 1 is a cross-sectional view of a conventional apparatus for drying semiconductor wafers using a conventional IPA vapor drying method.

FIG. 1 is a cross-sectional view of a conventional apparatus for drying semiconductor wafers using a conventional IPA vapor drying method according to an exemplary embodiment of the present invention. Referring to FIG. 1, the apparatus for drying semiconductor wafers includes a bath 200, which is provided so that a semiconductor wafer 100 can soak in DIW 210. In addition, a chamber 300 is included, which surrounds the bath 200 and overlaps an upper part of the bath 200.

The bath 200 includes a DIW outlet 220, through which the DIW 210 can drain. A semiconductor wafer supporter 230 is arranged under the semiconductor wafer 100 to support the semiconductor wafer 100. Guides are formed on the surface of the semiconductor wafer supporter 230 facing the semiconductor wafer 100. The structure of the guides will be described in greater detail hereinafter.

A pipeline 312 for supplying nitrogen gas and/or, a pipeline 314 for supplying nitrogen gas and IPA vapor, and a pipeline 320, through which overflowed DIW drains, are connected to the chamber 300. An outlet 330, through which nitrogen gas and IPA vapor in the chamber 300 drain to the outside, is provided through a sidewall of the chamber 300.

Figure 2A:
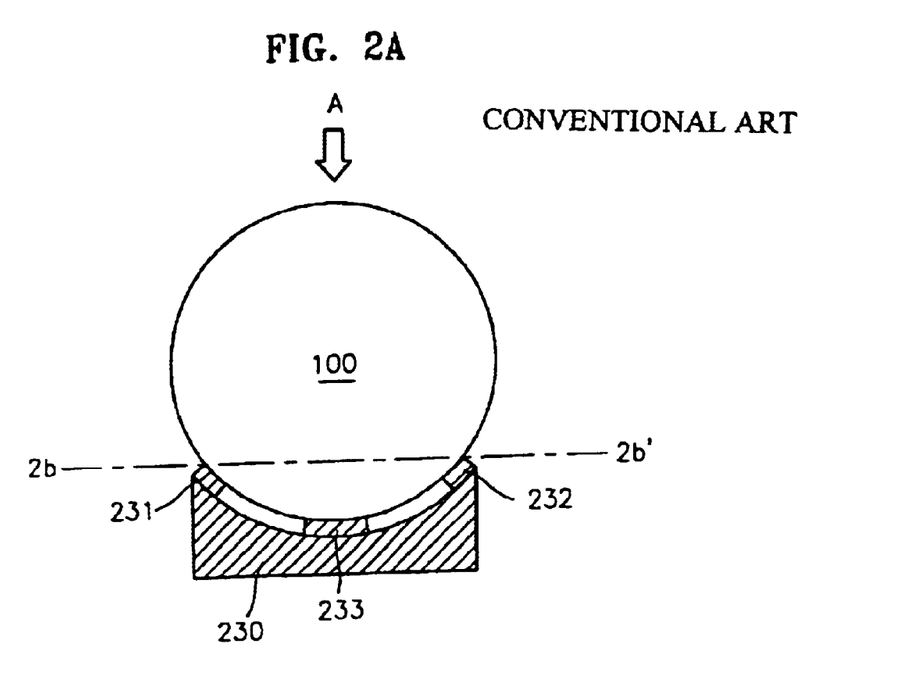
FIG. 2A is a diagram illustrating guides formed on a semiconductor wafer supporter of the apparatus for drying semiconductor wafers shown in FIG. 1.
Figure 2B:
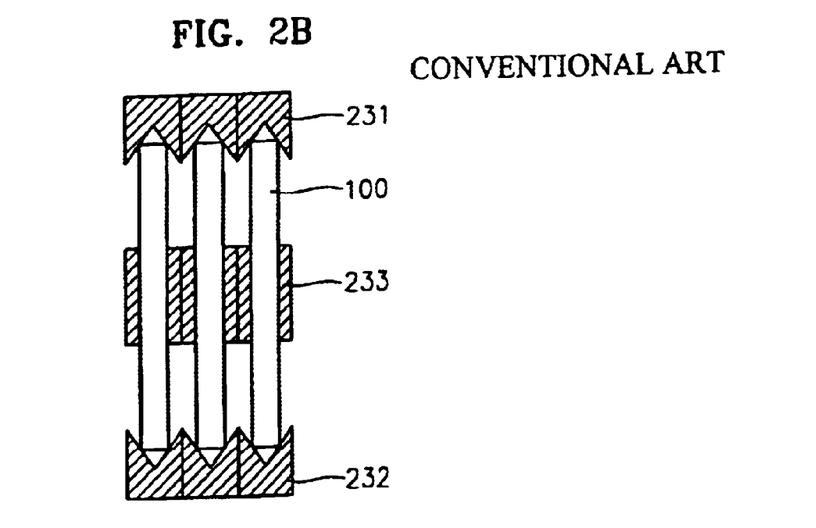
FIG. 2B is a cross-sectional view taken along line 2B–2B' of FIG. 2A and seen from a direction indicated by A.

FIG. 2A is a diagram illustrating guides formed on the semiconductor wafer supporter 230 of the apparatus for drying semiconductor wafers shown in FIG. 1. FIG. 2B is a cross-sectional view taken along line 2B–2B' of FIG. 2A and as seen from a direction indicated by A. Referring to FIGS. 2A and 2B, three guides, i.e., first, second, and third guides 231, 232, and 233, are formed on the surface of the semiconductor wafer supporter 230 facing the semiconductor wafer 100. The first and second guides 231 and 232 are formed to have a substantially V-shaped groove so that the semiconductor wafer 100 can be inserted in the substantially V-shaped grooves of the first and second guides 231 and 232. When a drying process is performed with semiconductor wafers supported by the semiconductor wafer supporter 230 having the three guides 231, 232, and 233, adjacent semiconductor wafers may be attached to one another, as will be described in greater detail in the following paragraphs.

Figure 3A:
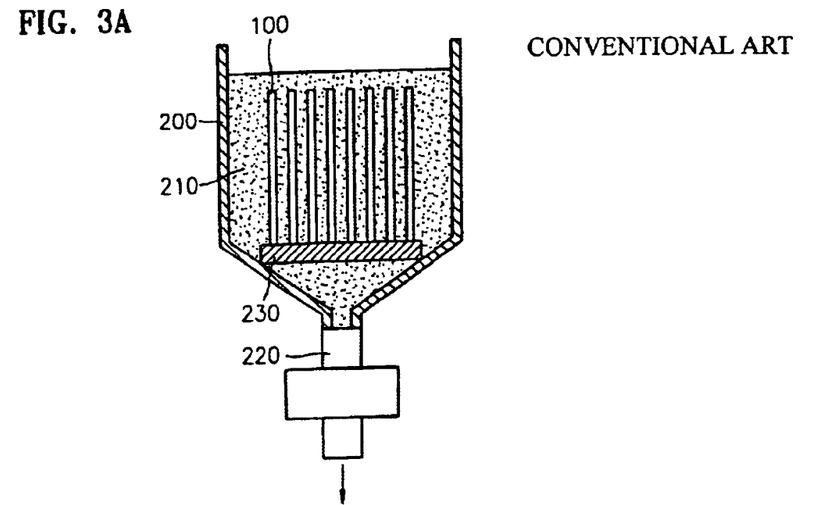
FIGS. 3A through 3D are diagrams illustrating a drying process performed in an apparatus for drying semiconductor wafers, including a semiconductor wafer supporter having three guide.

FIGS. 3A through 3D are diagrams illustrating a drying process performed in an apparatus for drying semiconductor wafers using a semiconductor wafer supporter having three guides. Referring to FIG. 3A, semiconductor wafers 100 are loaded in the bath 200 filled with the DIW 210. The semiconductor wafers 100 are supported by the semiconductor wafer supporter 230. The structure of the semiconductor wafers 100 being supported by the semiconductor wafer supporter 230 has been described above with reference to FIGS. 2A and 2B. When the semiconductor wafers 100 are loaded in the bath 200, the bath 200 is filled so that the semiconductor wafers 100 can completely soak in the DIW 210.

Figure 3B:
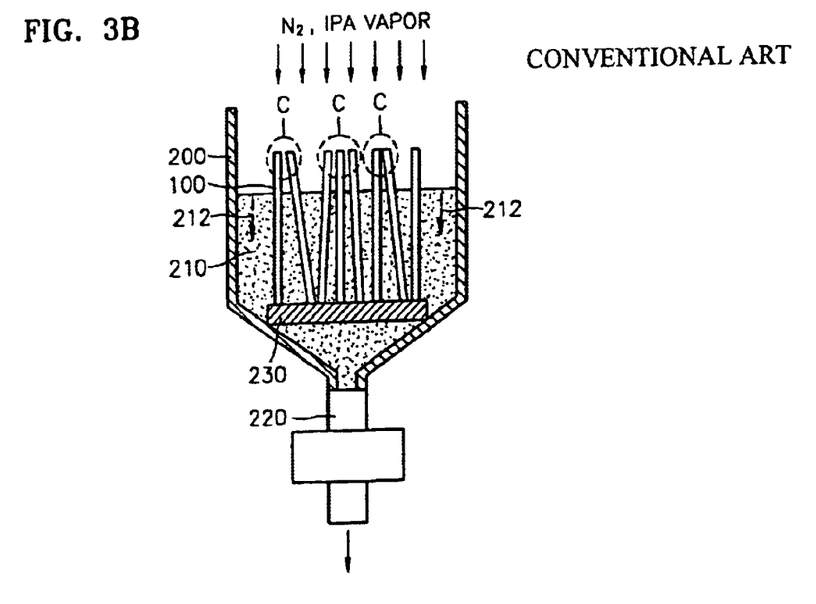

Referring to FIG. 3B, the DIW 210 is drained from the bath 200 through the DIW outlet 220, and nitrogen gas and IPA vapor are supplied toward the semiconductor wafers 100. The DIW 210, as marked by arrows 212 in FIG. 3B, is drained in a downward direction so that an upper part of each of the semiconductor wafers 100 is exposed. The IPA vapor supplied into the bath 200 removes any residual DIW 210 remaining on the surfaces of the semiconductor wafers 100. During the cleaning process, the semiconductor wafers 100 may move slightly, thereby possibly attaching to one another due to the surface tension therebetween. Various semiconductor wafers 100 in contact with each other are shown by points C in FIG. 3B.

Figure 3C:
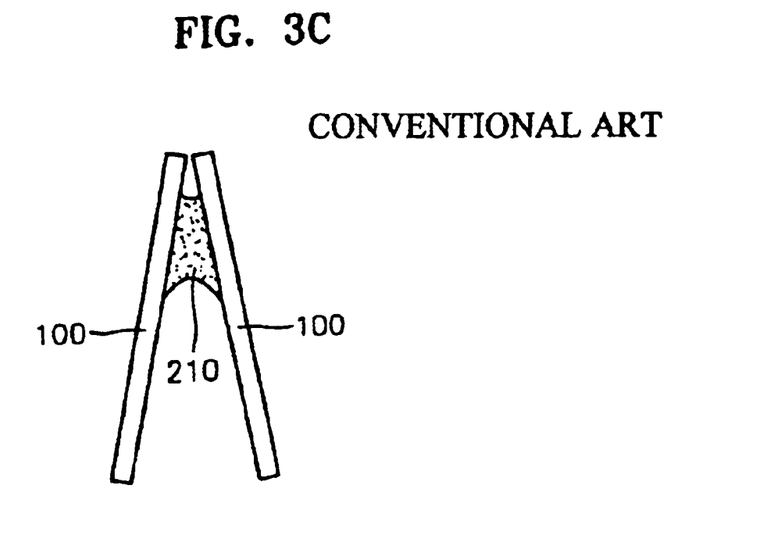
Figure 3D:
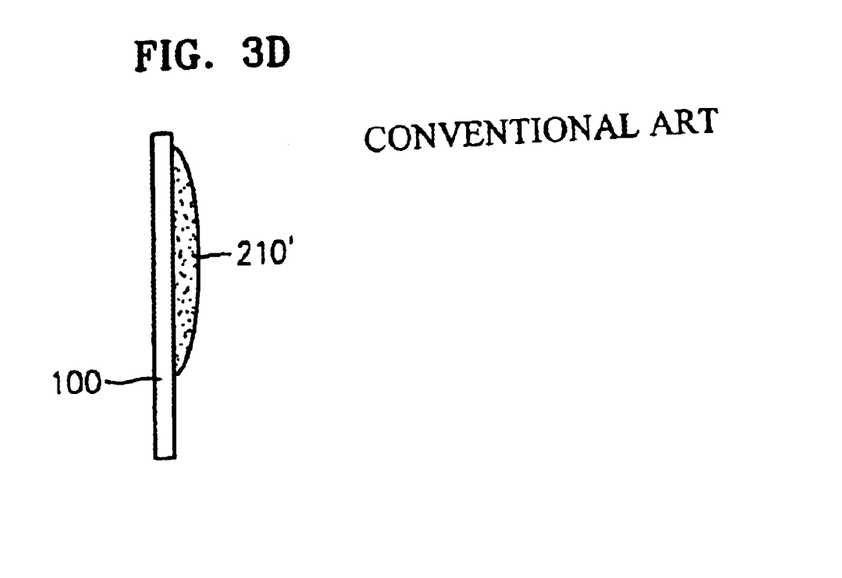

As shown in FIG. 3C, the DIW 210 may remain attached between the semiconductor wafers 100. Moreover, as illustrated in FIG. 3D, the remaining DIW 210 may flow down a surface of a semiconductor wafer 100 due to gravity. This may cause the occurrence of a water mark 210' on the surface of the semiconductor wafer 100.

Recently, the size of semiconductor wafers has increased. In particular, many semiconductor wafers are manufactured having a size greater than 200 mm. In order to batch-process a considerable number of semiconductor wafers having an increased size, with an apparatus for drying semiconductor wafers using IPA vapor, the drying process is performed using a half pitch technique where a plurality of semiconductor wafers are loaded in the apparatus so that a gap between the semiconductor wafers is very small. If the half pitch drying technique is used, semiconductor wafers may move laterally, which may cause a plurality of the semiconductor wafers to attach to one another. If adjacent semiconductor wafers attach to one another during a drying process, DIW is likely to remain on the surface of the semiconductor wafers and ultimately leave watermarks. When this happens, device malfunctions may occur.

SUMMARY OF THE INVENTION

The exemplary embodiment of the present invention provides an apparatus for drying semiconductor wafers using an IPA vapor drying method, which reduces the likelihood that semiconductor wafers attach to one another during a drying process.

According to an exemplary embodiment of the present invention, an apparatus for drying semiconductor wafers includes a bath for receiving semiconductor wafers and for holding a fluid, a chamber for providing an area where vapor is flowable over the bath, a supply pipeline for supplying vapor to the chamber, a vapor discharging pipeline for expunging vapor in the chamber, a fluid discharging pipeline for draining fluid from the chamber therefrom, and a protector for maintaining a distance between the semiconductor wafers during a drying process.

The protector may be positioned so that a line connecting the center of the semiconductor wafers and the protector forms an angle of 0–45° with a horizontal line passing through the center of the semiconductor wafers.

The protector may be positioned so that the line connecting the center of the semiconductor wafers and the protector forms an angle of 22.5° with the horizontal line passing through the center of the semiconductor wafers.

Furthermore, an exemplary embodiment of the present invention provides an apparatus for drying a semiconductor wafers including a bath for receiving semiconductor wafers and for holding deionized water, a chamber for providing an area where vapor is flowable over the bath, a supply pipeline for supplying isopropyl alcohol (IPA) vapor to the chamber, an IPA vapor discharging pipeline for expunging vapor from the chamber, a fluid discharging pipeline for draining deionized water in the chamber therefrom, and a semiconductor wafer supporter arranged in the bath so as to support the semiconductor wafers, the supporter having a plurality of guides for receiving the semiconductor wafers, and a protector provided between the semiconductor wafers for maintaining a minimum distance between individual semiconductor wafers.

The protector may be positioned so that a line connecting the center of the semiconductor wafers and the protector forms an angle of 0–45° with a horizontal line passing through the center of the semiconductor wafers.

The protector may be positioned so that the line connecting the center of the semiconductor wafers and the protector forms an angle of 22.5° with the horizontal line passing through the center of the semiconductor wafers.

In addition, a semiconductor drying apparatus according to an exemplary embodiment of the present invention includes a bath, and a supporting member positioned within the bath, the supporting member having at least one protector for reducing the likelihood that adjacent semiconductor wafers positioned on the supporting member will come into contact.

Further scope of applicability of the present invention will become apparent from the detailed description given hereinafter. However, it should be understood that the detailed description and specific examples, while indicating exemplary embodiments of the present invention, are given by way of illustration only, since various changes and modifications within the spirit and scope of the invention will become apparent to those skilled in the art from this detailed description.

BRIEF DESCRIPTION OF THE DRAWINGS

The exemplary embodiments of the present invention will become more fully understood from the detailed description given hereinbelow and the accompanying drawings which are given by way of illustration only, and thus are not limitative of the present invention, and wherein.

DETAILED DESCRIPTION OF THE INVENTION

The present invention will be described more fully with reference to the accompanying drawings. The present invention may be embodied in many different forms and, therefore, should not be construed as being limited to the exemplary embodiments set forth herein.

In order to reduce the possibility that adjacent semiconductor wafers will contact one another during a drying process, an apparatus for drying semiconductor wafers according to an exemplary embodiment of the present invention may include a semiconductor wafer supporter having two protectors as well as three guides.

Figure 4A:
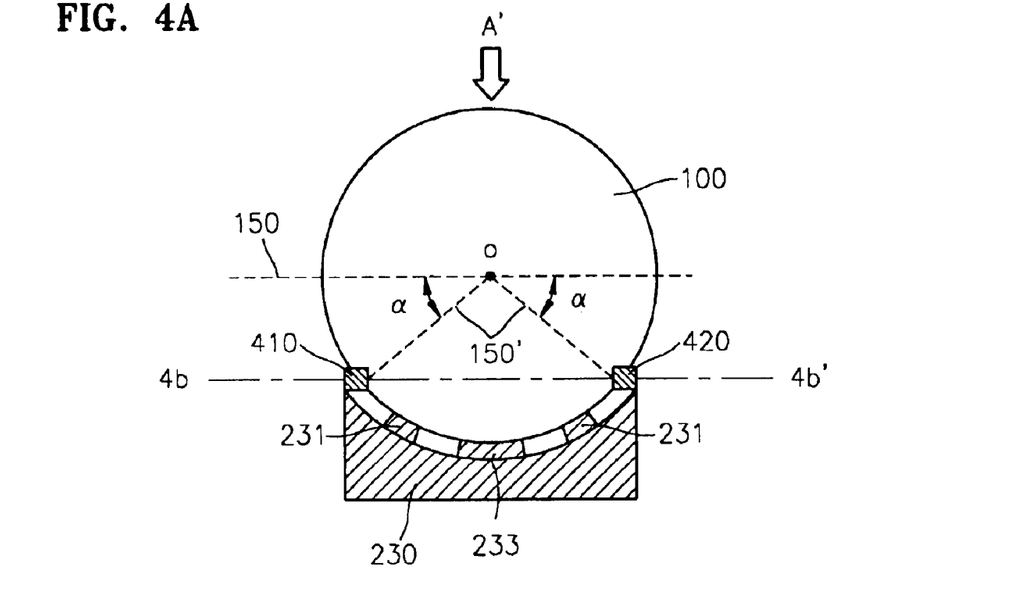
FIG. 4A is a diagram illustrating a protector and guides formed in a semiconductor wafer supporter of an apparatus for drying semiconductor wafers according to an exemplary embodiment of the present invention.
Figure 4B:
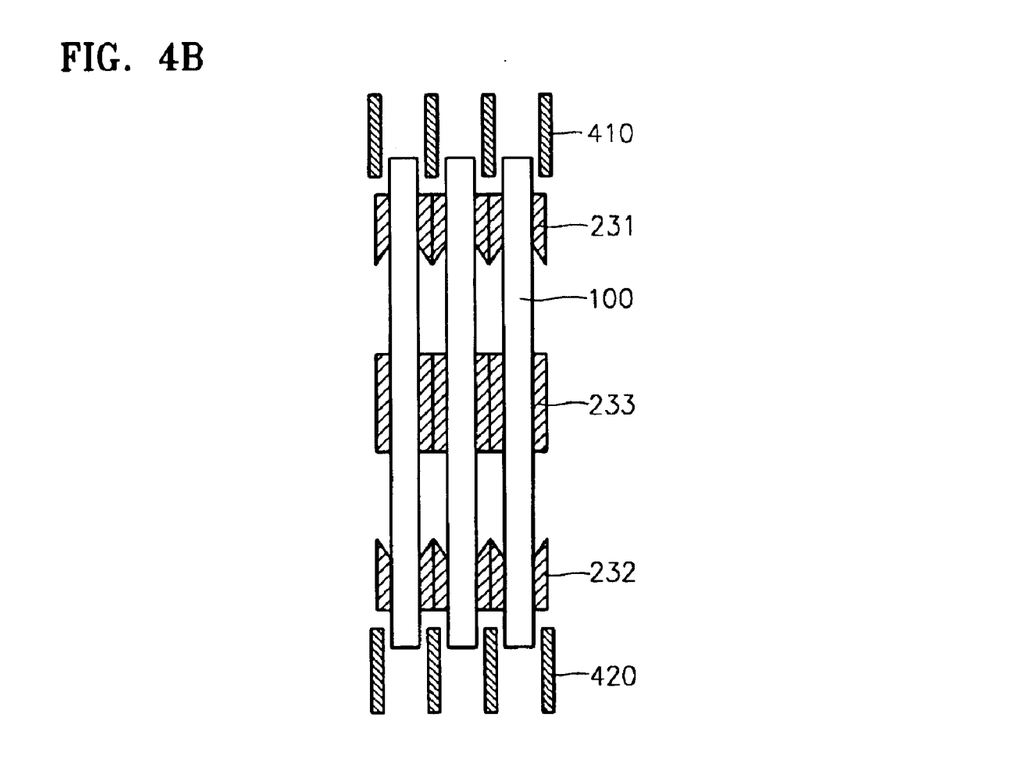
FIG. 4B is a cross-sectional view taken along line 4B–4B' of FIG. 4A and seen from a direction indicated by A'.

FIG. 4A is a diagram illustrating guides and protectors formed on a semiconductor wafer supporter of an apparatus for drying semiconductor wafers according to an exemplary embodiment of the present invention. FIG. 4B is a cross-sectional view taken along line 4B–4B' of FIG. 4A and seen from a direction indicated by A'. Referring to FIGS. 4A and 4B, two protectors, i.e., first and second protectors 410 and 420, as well as three guides, i.e., first, second, and third guides 231, 232, and 233 are formed on the surface of a semiconductor wafer supporter 230 facing a semiconductor wafer 100. The first and second guides 231 and 232 are formed to have, for example, a substantially V-shaped groove so that the semiconductor wafer 100 can be inserted into the substantially V-shaped grooves of the first and second guides 231 and 232. The third guide 233 is formed to have, for example, a substantially Y-shaped groove so that the semiconductor wafer 100 can be inserted into the substantially Y-shaped groove.

The shapes of the various groves may be modified as required by the type of semiconductor wafers 100 used in the drying apparatus. The specific groove shapes disclosed herein are given by way of example.

The first and second protectors 410 and 420 are arranged between adjacent semiconductor wafers 100 so as to reduce the possibility that adjacent semiconductor wafers 100 will attache to one another during a drying process. The first and second protectors 410 and 420 are positioned below a horizontal line passing through the center of the semiconductor wafer 100, so that a line 150' between the center of the semiconductor wafer 100 and the first or second protector (410 or 420) forms an angle α of about 0–45° with the horizontal line. When the angle α is approximately 22.5°, the effect of reducing the likelihood that adjacent semiconductor wafers 100 will attach to one another may be increased. The positions of the first and second protectors 410 and 420 need not affect the operation of automation technology used to load or unload the semiconductor wafers 100.

Figure 5A:
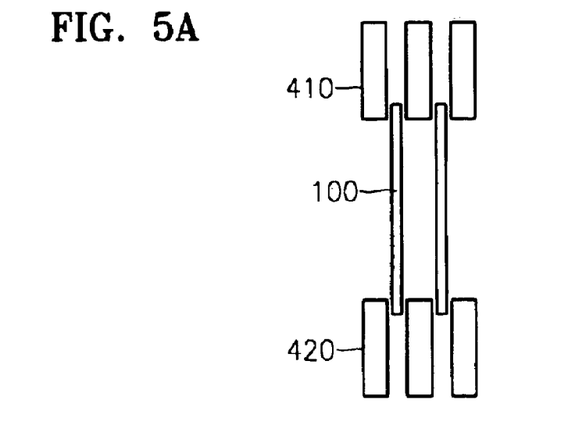
FIGS. 5A through 5C are diagrams illustrating exemplary embodiments of first and second protectors shown in FIG. 4A.
Figure 5B:
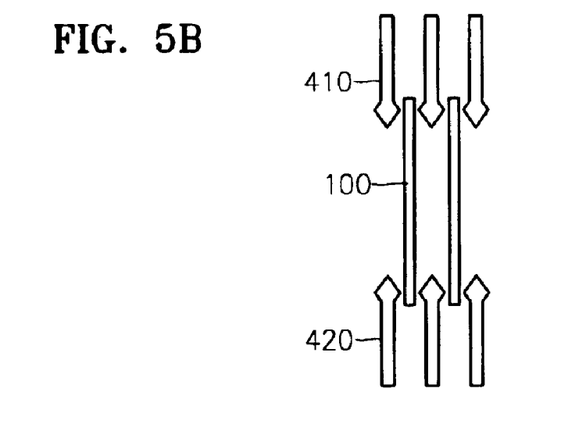
Figure 5C:
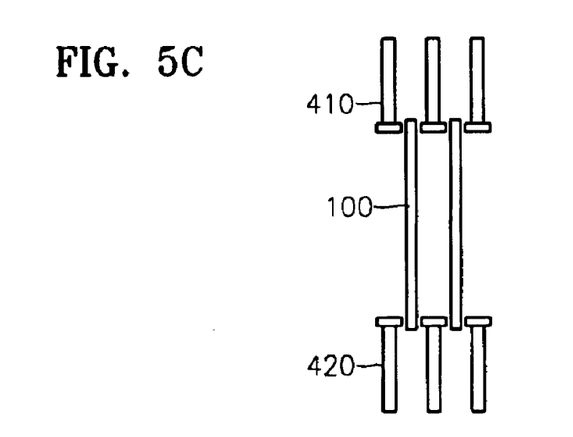

FIGS. 5A through 5C are diagrams illustrating various exemplary embodiments of the first and second protectors 410 and 420 shown in FIG. 4A.

Referring to FIG. 5A, the first and second protectors 410 and 420 are rectangle-shaped so that the area of the surfaces of the first and second protectors 410 and 420 contacting a semiconductor wafer 100 can be increased. Accordingly, it is possible to reduce the likelihood that adjacent semiconductor wafers 100 will attach to one another.

Referring to FIG. 5B, as is illustrated, the first and second protectors 410 and 420 have diamond-shaped end portions. The surface area of the first and second protectors 410 and 420 illustrated in FIG. 5B in contact with the semiconductor wafer 100 is reduced compared to other exemplary protector embodiments discussed herein. A watermark is less likely to be generated at the interface between the semiconductor wafer 100 and the first and second protectors 410 and 420 having the diamond-shaped end portions.

Referring to FIG. 5C, as is illustrated, the first and second protectors 410 and 420 are relatively thin and each has a perpendicular portion at one end thereof. The first and second protectors 410 illustrated in FIG. 5C are referred to as having a "stick-shape." The surface area of the first and second protectors 410 and 420 illustrated in FIG. 5C in contact with the semiconductor wafer 100 is relatively small compared to the exemplary protector embodiment illustrated in FIG. 5A. Accordingly, a watermark is less likely to be generated at the interface between the semiconductor wafer 100 and the first and second protectors 410 and 420 having the stick-shape.

The exemplary embodiments illustrated in FIGS. 5A–5C should be considered as being only examples of the present invention. Other shapes and sizes for the first and second protectors 410 and 420 are well within the scope of the present invention. In particular, the protectors 410 and 420 may be triangular, elliptical, circular, etc., in shape. That is, the protectors may encompass entirely such shapes, or alternatively, only a portion of the protectors may have such a shape. Moreover, while two protectors (410 and 420) are shown in the included figures, the present invention may also be implemented with the use of a single protector. For example, a single protector may be used on a surface of the semiconductor wafer supporter 230 in order reduce the likelihood that semiconductor wafers will attach to each other. Deviations from the exemplary embodiments illustrated herein are within the purview of the present invention.

Figure 6A:
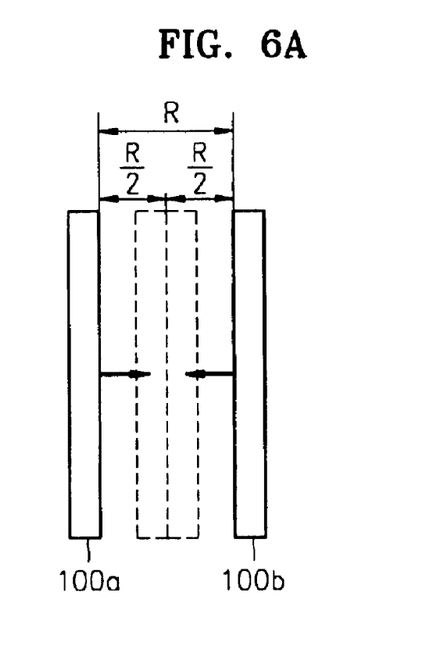
FIGS. 6A and 6B are diagrams illustrating the principle of the first and second protectors shown in FIG. 4A, for reducing the possibility that adjacent semiconductor wafers will come into contact, according to an exemplary embodiment of the present invention.
Figure 6B:
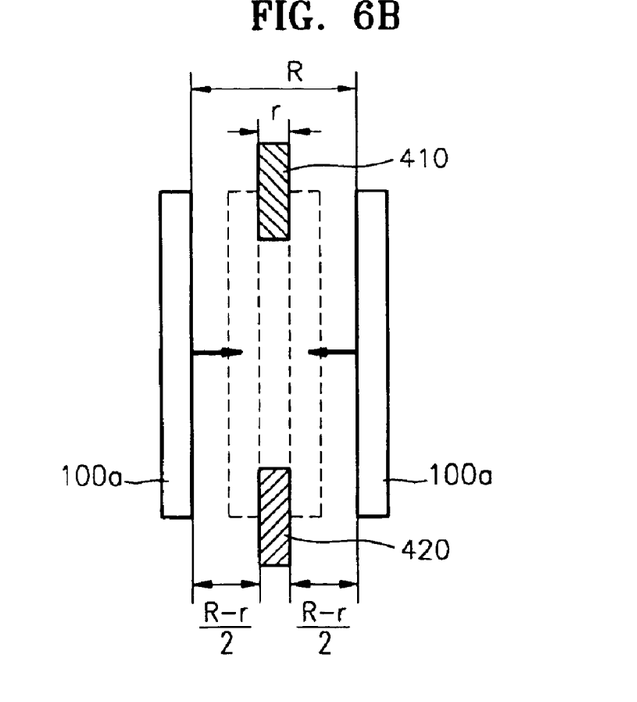

FIGS. 6A and 6B are diagrams illustrating the principle of the first and second protectors 410 and 420 for averting adjacent semiconductor wafers from attaching to one another. FIGS. 6A and 6B show semiconductor wafers seen from above.

As shown in FIG. 6A, if the first and second protectors 410 and 420 are not provided, the first and second semiconductor wafers 100a and 100b have a distance R therebetween. Therefore, the first and second semiconductor wafers 100a and 100b each have a movable distance of

TABLE 1

| Characteristic | 'MNIELE' | 'Delos' | 'Dorothy Clark' |
|---|---|---|---|
| Height (Mature) | 48–72 inches | 6 ft. | 3 ft. |
| Width (Mature) | 4–5 ft. | 6 ft. | 3 ft. |
| Flower Diameter | 4½ to 5½ in. | 2½ in. | 4½ in. |
| Flower Form | Single | Double | Single |
| Flower Color | Red | Light purplish-pink | Light pink center, Light red border |
| Flowers per Terminal | 2 to 3 | 2 | 2 |
| Bloom Period | Late March to Mid-April, occasionally reblooms from September until frost | Mid-April | Mid to Late April |
| Petal Number | 5 | 15 | 5 |
| Hardy Zone | 7a | 7 | 7 |
| Stamen Number | 8 | 0–1 | 10 |
| Stamen Type | Non-petaloid | Petaloid | Non-petaloid | to the right and to the left, respectively. In other words, the first semiconductor wafer 100a located on the left may move to the right by as much as a distance of $$\frac{R}{2}.$$

Likewise, the second semiconductor wafer 100a located on the right may move to the left by as much as a distance of $$\frac{R}{2}.$$

The greater the movable distance of each of the first and second semiconductor wafers 100a and 100b, the possibility the first and second semiconductor wafers 100a and 100b will slant increases. Once the first and second semiconductor wafers 100a and 100b start to slant, the force causing the first and second semiconductor wafers 100a and 100b to slant increases.

However, if the first and second protectors 410 and 420 are provided, as shown in FIG. 6B, the first and second semiconductor wafers 100a and 100b each have a movable distance of $$\frac{R-r}{2}$$

to the right and to the left, respectively, even though the first and second semiconductor wafers 100a and 100b have a distance of R therebetween, which is the same as in FIG. 6A. In other words, the first semiconductor wafer 100a may move to the right by as much as a distance of $$\frac{R-r}{2},$$

which is smaller than $$\frac{R}{2}.$$

Likewise, the second semiconductor wafer 100b may also move to the left by as much as a distance of $$\frac{R-r}{2}.$$

As the movable distance of each of the first and second semiconductor wafers 100a and 100b decreases, the first and second semiconductor wafers 100a and 100b are less likely to move laterally. In addition, since the distance between the first and second semiconductor wafers 100a and 100b cannot be smaller than the thickness (r) of the first and second protectors 410 and 420, it is possible to reduce the likelihood that the first and second semiconductor wafers 100a and 100b will attach to each other.

The exemplary embodiments of the present invention are not limited to drying apparatuses that use IPA vapor and DIW. In particular, the exemplary embodiments of the present invention may be used with drying apparatuses that use various types of vapors and fluids during a semiconductor drying process. Further, the exemplary embodiments of the present invention are not limited to a semiconductor wafer supporter having two protectors as well as three guides; other numbers of each, arranged in other geometries than described above, could be utilized as would be known to one of ordinary kill in the art.

While the present invention has been particularly shown and described with reference to exemplary embodiments thereof, it will be understood by those of ordinary skill in the art that various changes in form and details may be made therein without departing from the spirit and scope of the present invention as defined by the following claims.

As described above, the apparatus for drying semiconductor wafers using an IPA vapor drying method according to exemplary embodiments of the present invention supports semiconductor wafers using a semiconductor wafer supporter, on which one or more protectors capable of maintaining a distance between the semiconductor wafers are mounted. Accordingly, during a drying process, it is likely the semiconductor wafers will not attach to each other. In addition, it is possible to adjust a movable distance of each of the semiconductor wafers, taking advantage of the thickness of the protectors.

What is claimed is:

1. An apparatus for drying semiconductor wafers, comprising:
    a bath for receiving semiconductor wafers and for holding a fluid;
    a chamber for providing an area where vapor is flowable over the bath;
    a supply pipeline for supplying vapor to the chamber;
    a vapor discharging pipeline for expunging vapor from the chamber;
    a fluid discharging pipeline for draining fluid in the chamber therefrom;
    a support for receiving and holding the semiconductor wafers within the bath; and
    a protector having projecting portions arranged to extend between opposed primary surfaces of adjacent semiconductor wafers, whereby contact between the protector element is limited to contact with the primary surfaces of the semiconductor wafers for maintaining a predetermined distance between the semiconductor wafers during a drying process.

2. The apparatus of claim 1, wherein the protector is positioned so that a line connecting a center of at least one of the semiconductor wafers and the protector forms an angle of 0–45° with a horizontal line passing through the center of the at least one of the semiconductor wafers.

3. The apparatus of claim 1, wherein the protector is positioned so that a line connecting a center of at least one of the semiconductor wafers and the protector forms an angle of 22.5° with a horizontal line passing through the center of the at least one of the semiconductor wafers.

4. The apparatus of claim 1, wherein the bath is for holding deionized water.

5. The apparatus of claim 1, wherein the supply pipeline supplies isopropyl alcohol (IPA) vapor to the inside of the chamber.

6. The apparatus of claim 1, wherein the projecting portions of the protector have a substantially uniform and rectangular cross-section.

7. The apparatus of claim 1, wherein the projecting portions of the protector have a substantially uniform and circular cross-section.

8. The apparatus of claim 1, wherein the projecting portions of the protector have a supporting portion and a contact portion, the contact portion being enlarged relative to the supporting portion, whereby contact between the projecting portions and the primary surface of a semiconductor wafer is confined to the contact portion, the supporting portion being substantially diamond-shaped.

9. An apparatus for drying semiconductor wafers, comprising:
    a bath for receiving semiconductor wafers and for holding deionized water;
    a chamber for providing an area where vapor is flowable over the bath;
    a supply pipeline for supplying isopropyl alcohol (IPA) vapor to the chamber;
    an IPA vapor discharging pipeline for expunging vapor from the chamber;
    a fluid discharging pipeline for draining deionized water in the chamber therefrom; and
    a semiconductor wafer supporter arranged in the bath so as to support the semiconductor wafers, the supporter having a plurality of guides for receiving the semiconductor wafers, and a protector having projecting portions arranged and configured to extend between opposing primary surfaces of adjacent semiconductor wafers, whereby contact between the semiconductor wafers and the protector element is limited to contact between the projecting portions and the primary surfaces of the semiconductor wafers for maintaining a distance between individual semiconductor wafers.

10. The apparatus of claim 9, wherein the protector is positioned so that a line connecting a center of at least one of the semiconductor wafers and the protector forms an angle of 0–45° with a horizontal line passing through the center of the at least one of the semiconductor wafers.

11. The apparatus of claim 9, wherein the protector is positioned so that a line connecting a center of at least one of the semiconductor wafers and the protector forms an angle of 22.5° with a horizontal line passing through the center of the at least one of the semiconductor wafers.

12. The apparatus of claim 9, wherein the projecting portion of the protector extending between adjacent wafers has a substantially uniform and rectangular cross-section.

13. The apparatus of claim 9, wherein the projecting portion of the protector has a substantially uniform round cross-section.

14. The apparatus of claim 9, wherein the projecting portion of the protector includes an enlarged end structure whereby contact between the semiconductor wafer and the protector is substantially limited to contact between the enlarged end structure and a primary surface of the semiconductor wafer, the end structure having a substantially diamond-shaped cross-section.

15. A semiconductor wafer drying apparatus, comprising:
a bath; and
a supporting member positioned within the bath, the supporting member arranged and configured to support a plurality of semiconductor wafers within the bath; and
at least two protectors, each protector having a plurality of projecting portions arranged and configured to extend between peripheral portions of the primary surfaces of adjacent semiconductor wafers whereby contact between the protectors and the semiconductor wafers is substantially limited to the projecting portions and the primary surfaces of the semiconductor wafers for reducing the likelihood that adjacent semiconductor wafers positioned on the supporting member will come into contact.

16. The apparatus of claim 15, wherein the projecting portions of the protectors have a substantially uniform rectangular cross-section.

17. The apparatus of claim 15, wherein each of the projections portions of the protectors has a enlarged diamond shaped portion arranged at a distal end.

18. The apparatus of claim 15, wherein the projecting portions of each protector terminate in flanges extending in a direction substantially perpendicular to a longitudinal axis of the projecting portions.

19. The apparatus of claim 15, wherein an angle of no more than 45° is formed between a radial line drawn from a semiconductor wafer center to each of the protectors and a horizontal line drawn through the semiconductor wafer center.

20. The apparatus of claim 15, wherein an angle of 22.5° is formed between a radial line drawn from a semiconductor wafer center to each of the protector elements and a horizontal line drawn through the semiconductor wafer center.

21. The apparatus of claim 15, wherein the bath is fillable with deionized water.

22. A semiconductor drying method, comprising:
placing a semiconductor wafer on a supporting member, the supporting member arranged and configured to support the semiconductor wafer in a substantially vertical orientation; and
positioning at least two protectors adjacent to, but separated from, an outer edge of the semiconductor wafer, the protectors having projecting portions that extend inwardly across a primary surface of the semiconductor wafer, whereby deflection of the semiconductor wafer from the substantially vertical orientation will be limited by contact between a projecting portion and a primary surface of the semiconductor wafer.

23. The method of claim 22, further comprising supporting the semiconductor wafer by way of a plurality of guides positioned on a surface of the supporting member.

24. A semiconductor drying method, comprising:
placing at least one semiconductor wafer on a supporting member;
reducing lateral movement of the at least one semiconductor wafer utilizing the apparatus according to claim 15.

25. An apparatus for drying semiconductor wafers, comprising:
a bath for receiving semiconductor wafers and for holding a fluid;
a chamber for providing an area where vapor is flowable over the bath;
a supply pipeline for supplying vapor to the chamber;
a vapor discharging pipeline for expunging vapor from the chamber;
a fluid discharging pipeline for draining fluid in the chamber therefrom;
a plurality of wafer support surfaces, each of the support surfaces having a series of recesses arranged and configured to receive and maintain substantially continuous contact with peripheral portions of a plurality of wafers and thereby support the plurality of wafers in a generally parallel orientation whereby adjacent wafers are separated by a nominal separation distance; and
a plurality of protectors having projecting portions arranged and configured to extend between the opposed primary surfaces of adjacent wafers, whereby contact between the protectors and the semiconductor wafers is substantially limited to contact with a major surface of one or both of the adjacent wafers to maintain a minimum separation distance, the contact between the protectors and the semiconductor wafers occurring only when at least one of the adjacent wafers deviates from the generally parallel orientation; wherein the minimum separation distance is sufficient to prevent contact between adjacent wafers during a drying process.

26. An apparatus for drying semiconductor wafers, comprising:
a bath for receiving semiconductor wafers and for holding a fluid;
a chamber for providing an area where vapor is flowable over the bath;
a supply pipeline for supplying vapor to the chamber;
a vapor discharging pipeline for expunging vapor from the chamber;
a fluid discharging pipeline for draining fluid in the chamber therefrom;

a plurality of wafer support surfaces, each of the support surfaces having a series of recesses arranged and configured to receive and maintain substantially continuous contact with peripheral portions of a plurality of wafers and thereby support the plurality of wafers in a generally parallel orientation whereby adjacent wafers are separated by a nominal separation distance; and a plurality of protectors having projecting portions arranged and configured to extend between the opposed primary surfaces of adjacent wafers, whereby contact between the protectors and the semiconductor wafers is substantially limited to contact with a major surface of one or both of the adjacent wafers to maintain a minimum separation distance, the contact between the protectors and the semiconductor wafers occurring only when at least one of the adjacent wafers deviates from the generally parallel orientation;

wherein the minimum separation distance is sufficient to prevent contact between adjacent wafers during a drying process;

and further wherein the projecting portions include distal and proximal portions having dimensions generally normal to the major surface of an adjacent wafer having a ratio of at least 1.

* * * * *